United States Patent [19]

Kolm et al.

[11] 4,383,195
[45] May 10, 1983

[54] PIEZOELECTRIC SNAP ACTUATOR

[75] Inventors: Henry H. Kolm, Wayland; Eric A. Kolm, Brookline, both of Mass.

[73] Assignee: Piezo Electric Products, Inc., Cambridge, Mass.

[21] Appl. No.: 200,390

[22] Filed: Oct. 24, 1980

[51] Int. Cl.³ .............................................. H01L 41/08
[52] U.S. Cl. .................................. 310/330; 310/332; 200/181
[58] Field of Search ............... 310/328, 339, 330, 332; 200/181

[56] References Cited

U.S. PATENT DOCUMENTS

| 2,587,482 | 2/1952 | Keller | 310/328 |
| 2,714,642 | 8/1955 | Kinsley | 310/332 X |
| 2,800,551 | 7/1957 | Crownover | 310/332 X |
| 2,835,761 | 5/1958 | Crownover | 310/228 X |
| 2,916,578 | 12/1959 | Crownover | 200/181 |
| 3,940,637 | 2/1976 | Ohigashi et al. | 310/339 |
| 3,976,899 | 8/1976 | Fanshawe | 310/339 |

FOREIGN PATENT DOCUMENTS

| 783672 | 4/1968 | Canada | 200/181 |
| 1095042 | 12/1967 | United Kingdom | 200/181 |
| 1096824 | 12/1967 | United Kingdom | 200/181 |

Primary Examiner—Mark O. Budd
Attorney, Agent, or Firm—Joseph S. Iandiorio

[57] ABSTRACT

A piezoelectric actuator including a piezoelectric element; a snap-action device for exerting a positive force in opposition to the piezoelectric element and having a predetermined reaction force that must be overcome to cause the snap action; the piezoelectric element including piezoelectric means for providing an opposing force to the snap-action device in excess of the reaction force; and means for applying an electric field to the piezoelectric means to enable it to generate the opposing force and store energy in the snap-action device to enable occurrence of the snap action.

2 Claims, 6 Drawing Figures

PIEZOELECTRIC SNAP ACTUATOR

FIELD OF INVENTION

This invention relates to a piezoelectric actuator, and more particularly to such an actuator in which a piezoelectric element is coupled with a snap-action device.

BACKGROUND OF INVENTION

Piezoelectric actuators have many advantages not obtainable with magnetically and hydraulically operated actuators for controlling relays, valves and the like. They are small, energy efficient, have no great dissipation problem, and have quicker response time compared to devices relying on massive magnetic armatures or hydraulic, pneumatic or other mechanical devices. They are inherently less expensive and resistant to shock and vibration. Since they can be operated on very short voltage pulses, they are readily compatible with conventional logic circuits and contemporary integrated solid state fabrication methods. Further, since they can be made bistable without complex mechanical latching or double actuator coils or drives, they offer a fail-safe switching memory.

Nevertheless, piezoelectric actuators have not met with great success, for while a piezoelectric crystal will exert a considerable force against an enclosure, its motion is quite small and normally insufficient to operate a switch or valve. Schemes to overcome this limited motion problem include using the piezoelectric member to squeeze a drop of mercury through a constriction between two central chambers and employing the piezoelectric means to make a bending element, usually by mounting the piezoelectric means on a metal surface. The structure can be made with one or more piezoelectric layers and are known variously as bi-morphs, polymorphs, bi-lams, and more generally as bending elements. Such bending elements have sufficient motion to operate switch contacts, but the closing contact force is poor. This is so because the force decreases to zero at the end of the stroke. If the contacts are set to meet before the end of the stroke then a significant force is present. However, when the piezoelectric bending element is stopped before the end of its travel it stalls: produces a back EMF corresponding to the opposing force and the contact force drops off. The applied voltage must therefore be increased to maintain the force. Unfortunately, the level of the increased voltage often is sufficient to depolarize the portion of the element which is oppositely polarized.

Among the attempts to overcome this aspect of the problem is an approach in which only one piezoelectric member is used so that there are no other oppositely polarized members which can be depolarized. Thus the element can be subjected to whatever level of voltage is necessary to overcome the back EMF and use the higher force available at midstroke. Further a snap-action or over-center spring is used to apply a negative force, push with the piezoelectric bending element, to help it overcome the back EMF. This requires a prolonged drive voltage to oppose the back EMF and is not fail-safe or bistable, as the element returns when the voltage is removed.

SUMMARY OF INVENTION

It is therefore an object of this invention to provide an improved piezoelectric actuator which produces substantial travel and terminal force.

It is a further object of this invention to provide such an improved piezoelectric actuator which utilizes a piezoelectric bending element to store energy in a snap-action device.

It is a further object of this invention to provide such an improved piezoelectric actuator which operates without stalling the piezoelectric medium and without inducing counterproductive back EMF in the medium.

It is a further object of this invention to provide such an improved piezoelectric actuator which does not require large, prolonged drive voltages and can use more than one piezoelectric member without risk of depolarization of one or more of the piezoelectric members.

It is a further object of this invention to provide such an improved piezoelectric actuator which can be driven by a short duration drive voltage pulse and can be made bistable for fail-safe operation.

This invention results from the realization that a truly effective and efficient piezoelectric actuator can be made by using a piezoelectric element to generate a force in excess of that required to trigger a snap-action device and store energy in the snap-action device until the snap action occurs and thereby transfer the energy generated by the piezoelectric element, which is capable of only short travel and low terminal force, to the snap-action device which provides a longer travel and high terminal force.

This invention features a piezoelectric acutator including a piezoelectric element which drives a snap-action device. The snap-action device exerts a positive force in opposition to the movement of the piezoelectric element and has a predetermined reaction force that must be overcome by the piezoelectric element in order to cause the snap-action to occur. The piezoelectric bending element includes piezoelectric means which provide an opposing force to the snap-action device in excess of the reaction force. There are means for applying an electric field to the piezoelectric means to enable it to generate the opposing force and store energy in the snap-action device to enable occurrence of the snap action. The piezoelectric element may be a piezoelectric bending element.

In a preferred embodiment, the snap-action device is bistable. When the piezoelectric actuator is used to drive a switching mechanism there may be provided a contact on the snap-action device which is moved to make or break with a second contact which is typically fixed against movement. Alternatively, the piezoelectric element may contain the moving contact which makes or breaks with the fixed contact, in response to the movement of the snap-action device, which drives the piezoelectric element.

The piezoelectric means may include a piezoelectric member mounted on the snap-action device, and the snap-action device may be dish-shaped with an electrode near its center and a second electrode near its edge, to apply the electric field to the piezoelectric member. Alternatively, the piezoelectric means may include two piezoelectric members mounted and separated by the snap-action device, which again may be dish-shaped and may include two pairs of electrodes, one associated with each of the piezoelectric members.

The snap-action device may be bistable for a bistable actuator operation, and the piezoelectric means may include more than two members.

The piezoelectric means need not be mounted on the snap-action device itself; it may be mounted on a support member. Two piezoelectric members may be mounted on and separated by such a support member, and additional support members and piezoelectric members may be used. The snap-action device may be integral with the support member but extend beyond the piezoelectric member or members carried by the support member.

Alternatively, the snap-action device may be separate from the piezoelectric element with some means to transfer the motion from one to the other.

DISCLOSURE OF PREFERRED EMBODIMENT

Other objects, features and advantages will occur from the following description of a preferred embodiment and the accompanying drawings, in which.

Figure 1:
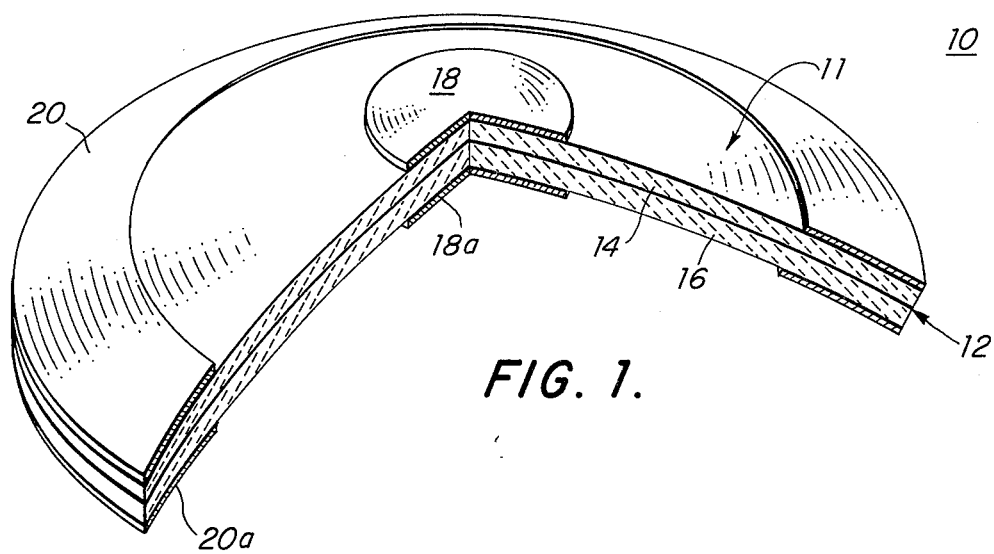
FIG. 1 is an axonometric view with portions broken away of a bistable piezoelectric actuator according to this invention in which the piezoelectric material is supported on the snap-action device.

The piezoelectric actuator of this invention may be accomplished using a piezoelectric bending element and a snap-action device. The piezoelectric bending element may include a single piezoelectric member carried on a support member or on the snap-action device itself. There may be two or more piezoelectric bending elements arranged in laminar form with interstitial support members. Typically a single-member piezoelectric bending element is used to drive a monostable snap-action device, whereas a piezoelectric bending element with two or more piezoelectric members is used to drive a bistable snap-action device. By snap-action device is meant both the stressed metal type of a device, either monostable or bistable, often referred to as "crickets" in children's toys and commonly used in the bottom of oil cans, as well as other overcenter devices made by combinations of springs and levers for example.

However constructed, the snap-action device exerts a positive force against the piezoelectric bending element in opposition to the motion of the piezoelectric bending element. The snap-action device has a predetermined reaction force which must be overcome in order to cause the snap action or overcenter motion. The piezoelectric bending element includes piezoelectric means including one or more members for providing an opposing force in excess of the reaction force of the snap-action device. In bistable operations the reaction force of the snap-action device has essentially the same magnitude in both directions. In a monostable snap-action device the force required to hold it in the unstable condition is very small and does not stall the piezoelectric bending element. There are means for applying an electric field to the piezoelectric means to enable it to generate the opposing force and to store energy in the snap-action device to enable the occurrence of the snap action. The means for supplying the electric field may be simply a pair of electrodes to which a voltage may be applied.

The piezoelectric actuator of this invention is applicable to: electric relay switches, single and double throw, monostable and bistable, single and multiple pole; hydraulic and pneumatic valves, both monostable and bistable; locks and locking devices which are electrically operable; electrically operable mechanical clutches and other engagement devices or triggering devices; impact printers of the dot matrix or solid typeface variety; engraving or embossing devices for industrial or caligraphy applications; and any other use which requires the electric initiation of a mechanical motion.

Although for purposes of illustration throughout this specification the piezoelectric element is described as a bending element, it may in fact be any other piezoelectric element which accomplishes the function of deforming a bistable elastic element to its snap-over points. The piezoelectric element could in fact be a stack of disks or plates connected electrically in parallel so as to produce expansion and contraction at the minimum applied voltage, or any other piezoelectric structure capable of producing the required motion when subjected to an applied voltage.

When used as a switch, the piezoelectric actuator is provided with a moving contact on the snap-action device, which is moved to make or break with a second contact which is typically fixed. Alternatively, the moving contact may be mounted on the piezoelectric bending element, which is also driven by the motion of the snap-action device. The switch associated with the actuator may be a single or multiple pole, single or double throw. In addition to switches, the actuator of this invention may operate hydraulic or pneumatic devices, mechanical locks, latching devices, electromechanical clutches, optical shutters and the like. In accordance with the teaching of the prior art, a plurality of piezoelectric layers may be connected in parallel to obtain lower voltage operation, or in series to obtain higher voltage operation. It is contemplated that actuators according to this invention may be fabricated by the hundreds on a single printed circuit board, for use as relays or other devices in conjunction with other electronic equipment such as computers and the like.

There is shown in FIG. 1 bistable piezoelectric actuator 10 including a bistable snap-action device 12 in the form of a metal dish, and piezoelectric bending element 11 which includes piezoelectric layers 14 and 16 mounted on a support layer, which in this case is constituted by snap-action device 12. Actuator 10 is dish-shaped when in either of its two stable states, one of which is shown in FIG. 1. A pair of electrodes 18 and 20 are located one near the center and one near the edge of piezoelectric layer 14. Similar electrodes 18a, 20a are provided on piezoelectric layer 16. For use as an electrical switching device, actuator 10 may include contacts mounted on and insulated from electrodes 18 and 18a to obtain the maximum travel from the operation of actuator 10. Throughout the figures, like parts have been given like numbers accompanied by successive lower case letters.

Figure 2:
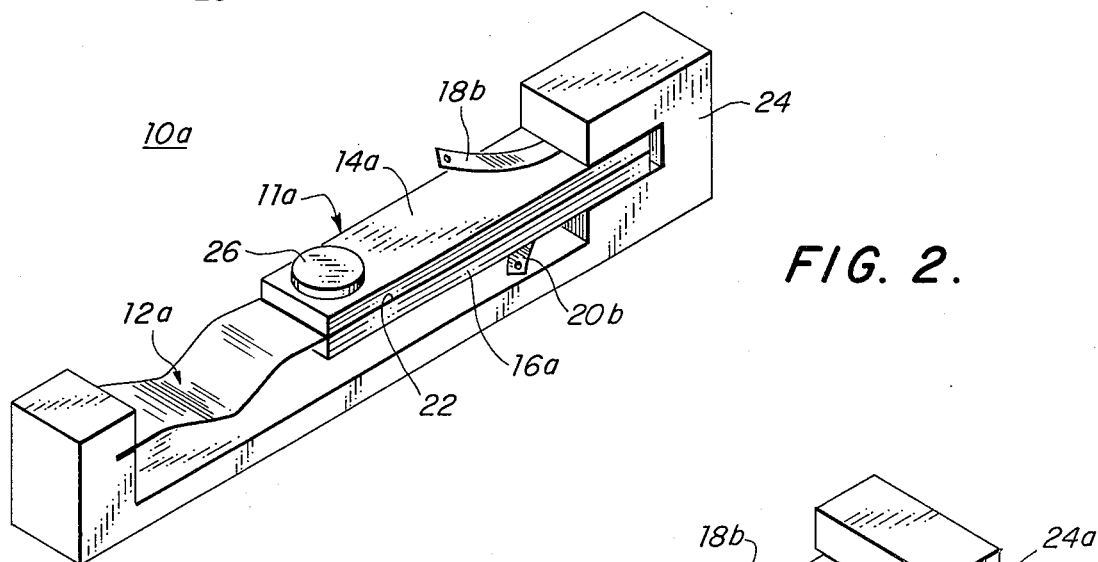
FIG. 2 is an axonometric view of a bistable piezoelectric actuator according to this invention in which the piezoelectric material is carried on a support plate which is integral with the snap-action device.

In another form, piezoelectric layers 14a and 16a, FIG. 2, may be mounted on a support layer 22 which is separate from but integral with a bistable snap-action device 12a. The free end of piezoelectric bending element 11a is supported by one end of frame 24, and the free end of snap-action device 12a on the other end. Actuator 10a is in one of its two stable states, as shown in FIG. 2. Application of a voltage to electrodes 18b and 20b will cause it to drive snap-action device 12a to the other stable state which it assumes: it moves from the presently shown concave configuration to a convex configuration. One or more contacts 26 are provided on the actuator used to operate a switching circuit.

Figure 3:
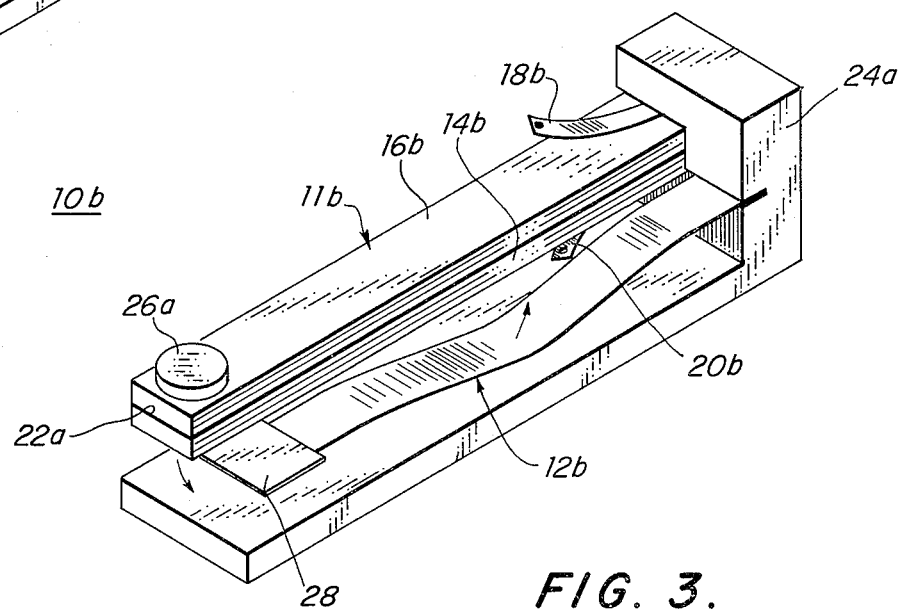
FIG. 3 is an axonometric view of a bistable piezoelectric actuator according to this invention in which the snap-action device is separate from the piezoelectric bending element.

Although thus far the support layer and snap-action device have been shown as a single member, this is not a necessary limitation of the invention. For example, as shown in FIG. 3, snap-action device 12b may be separate and independent of piezoelectric bending element 11b with some means, tab 28, for conveying the energy from piezoelectric element 11b to snap-action device 12b up to the point of triggering the snap action, and then transferring the motion and force of the snap-action device 12b back to the piezoelectric element 11b after that point. Tab 28 may be an integral portion of either element 11b or device 12b, and fixed to the other. The low-voltage, e.g. 40 volts, short-duration pulses, e.g. 0.1 milliseconds, required to operate actuators according to this invention, for example actuator 10a, and the fail-safe nature of the bistable operation, make them naturally compatible with state of the art logic circuits. Generally, the voltage required for a particular bending element depends upon the number of layers of piezoelectric material that it uses. A piezoelectric material which operates on 40 volts per layer and uses two layers would therefore require 80 volts if the voltage were applied across both layers, and 40 volts if the layers were connected electrically in parallel. With an eight-layer material, for example, similar material would only require ten volts with the layers all connected in parallel. Typically, operation should occur in the range of 5 to 40 volts, and when pulse actuation is used the pulse duration may be between 0.01 and 10 milliseconds.

Figure 4:
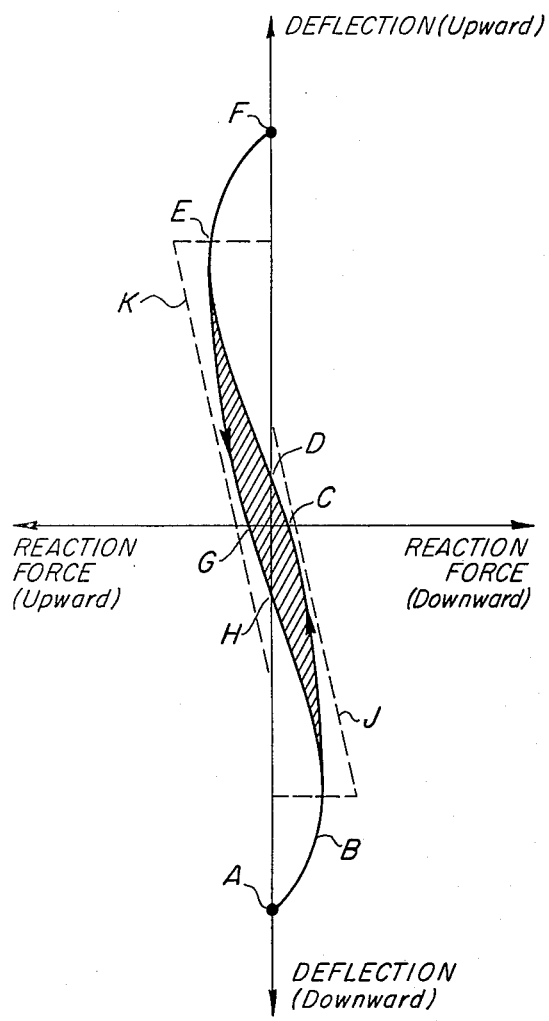
FIG. 4 illustrates a characteristic force vs. deflection curve for a bistable snap-action device.

The operation of the actuator of this invention may be better understood with reference to FIG. 4, which is a characteristic of the reaction force plotted against the deflection of a bistable snap-action device. Beginning at the stable position A, an increasing positive force is applied to the snap-action device and it deflects upward. At point B the reaction force of the snap-action device reaches a maximum and the force required to deflect it further begins to decrease. At C the snap-action device reaches its center position but still resists bending or executing the snap action or overcenter action. Once past that center, however, at D the opposition force decreases to zero and the snap-action device continues to deflect without the application of further force. After the overcenter action, the snap-action device comes to rest at its other stable position F after having passed through its maximum force point E. The portion of the snap-action device deflection from A to D represents its energy input requirement from the piezoelectric bending element, while the portion of the deflection from D to F represents the output from the snap-action device of the stored energy which is used to provide substantial deflection and terminal force attractive in operating switches and valves. When driven in the opposite direction the snap-action device deflects downwardly, passing through its center position at G and once again snapping over at H. The failure to retract exactly the same pattern is due to hysteresis in the snap-action device, which represents the energy dissipated by the device in executing a cycle of two strokes and is usually extremely small. The energy stored in the snap-action device is provided in this invention by the piezoelectric bending element. The force applied by the piezoelectric bending element during the energy input portion of the cycle is represented by dashed line J, and must exceed the reaction force at all points. Force J is a maximum near B and decreases to zero after point D. A similar force characteristic K is provided by the piezoelectric bending element for the return cycle. In this way the substantial force which generates only a small terminal force and a small stroke, when provided by the piezoelectric bending element, is transformed by the storage of the energy in the snap-action device into a large deflection and large terminal force.

Figure 5:
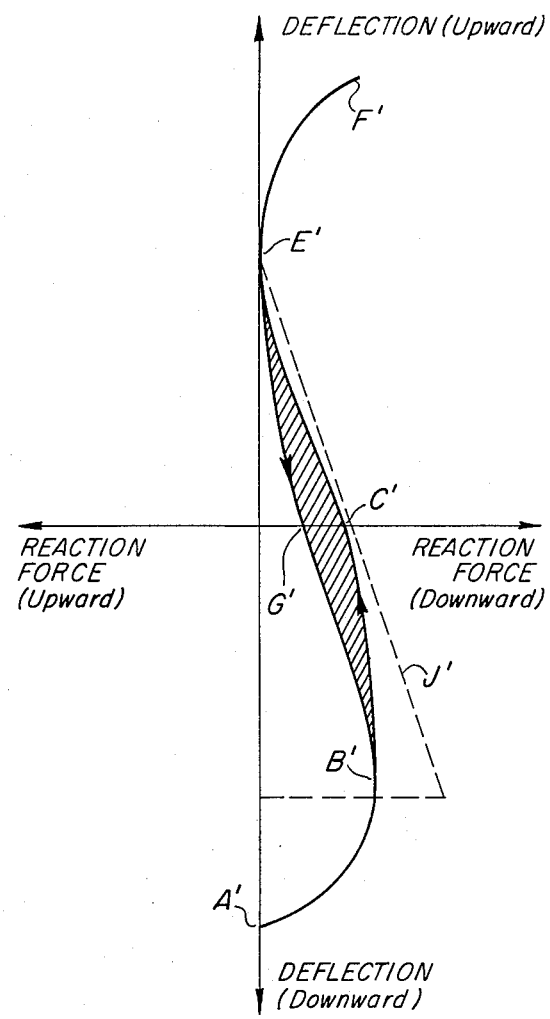
FIG. 5 is a characteristic force vs. deflection curve similar to FIG. 4 for a monostable snap-action device.

Monostable snap-action devices operate similarly, as shown by the characteristic in FIG. 5, wherein the curve has been transposed laterally so that it is entirely on the positive side of the force axis. In this situation the energy stored by the force J' provided by the piezoelectric bending element decreases virtually to zero near E', and the snap-action device returns from F' through E' back to A' without the necessity for a reverse force, as is the case with the bistable snap-action device. Each of the embodiments shown in FIGS. 1, 2, and 3 are bistable actuators according to this invention and may be converted into monostable actuators by simply removing one of the piezoelectric members 14 or 16 and its associated electrodes and using a monostable, rather than a bistable, snap-action device.

Figure 6:
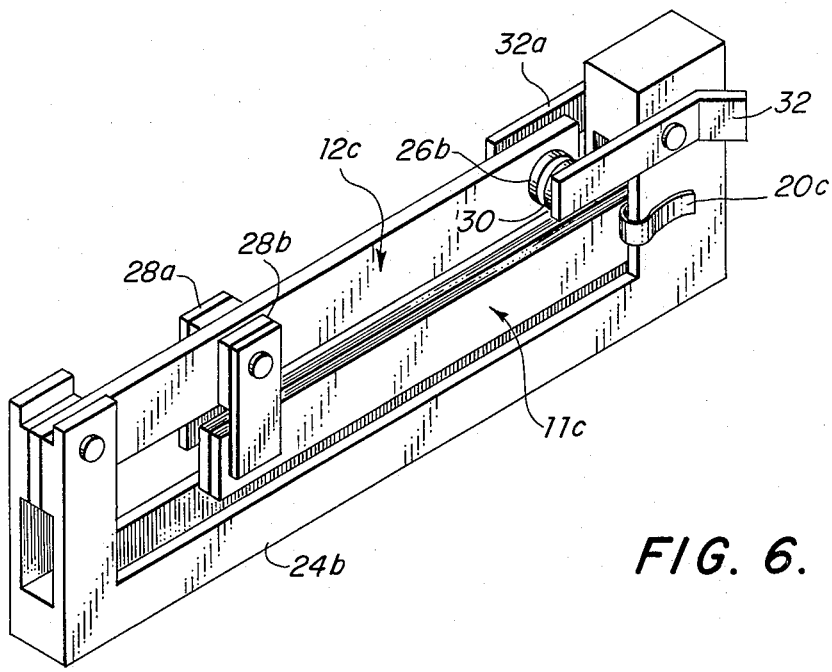
FIG. 6 is an axonometric view of another construction of a bistable piezoelectric actuator according to this invention in which the snap-action device and piezoelectric element are separate.

Although thus far the piezoelectric bending element 11c, FIG. 6, and snap-action device 12c, have been either integral or fastened together, this is not a necessary limitation of the invention. For example, snap-action device 12c may carry tabs 28a, 28b, which extend over and are spaced on either side of piezoelectric bending element 11c. As piezoelectric bending element 11c is energized through electrode 18c and 20c and bends in one direction or the other, it bears on one of tabs 28a and 28b and begins to load or store energy in snap-action device 12c. When sufficient energy is stored in it, snap-action device 12c snaps and, for example, moving contact 26b engages fixed contact 30 mounted on arm 32 of frame 24b or, alternatively, a similar contact mounted on the other side of snap-action device 12c contacts another fixed contact on arm 32a.

Other embodiments will occur to those skilled in the art and are within the following claims:

What is claimed is:

1. A piezoelectric actuator comprising:
   a piezoelectric bender element;
   a dish-shaped snap-action device for exerting a positive force in opposition to said piezoelectric bender element and having a predetermined reaction force that must be overcome to cause the snap action, said piezoelectric bender element being mounted on said snap-action device and including piezoelectric means for providing an opposing force to said snap-action device in excess of said reaction force;
   contact means operated by said piezoelectric bender element; and means, including a pair of electrodes one proximate the center and one proximate the edge of said piezoelectric member, for applying an electric field to said piezoelectric means to enable it to generate said opposing force and store energy in said snap-action device to enable occurrence of the snap action to open and close said contact means.

2. A piezoelectric actuator comprising:

a piezoelectric bender element;

a dish-shaped snap-action device for exerting a positive force in opposition to said piezoelectric bender element and having a predetermined reaction force that must be overcome to cause the snap action, said piezoelectric bender element being mounted on said snap-action device and having piezoelectric means including two piezoelectric members mounted on and separated by said snap-action device, means, including a pair of electrodes one proximate the center and one proximate the edge of said piezoelectric member, for applying an electric field to said piezoelectric means to enable it to generate said opposing force and store energy in said snap-action device to enable occurrence of the snap action to open and close said contact means.

* * * * *